United States Patent [19]

Matta

[11] Patent Number: 5,142,351
[45] Date of Patent: Aug. 25, 1992

[54] VIA-LESS TWO-METAL TAPE-AUTOMATED BONDING SYSTEM

[75] Inventor: Farid Matta, Mountain View, Calif.

[73] Assignee: Hewlett-Packard Company, Palo Alto, Calif.

[21] Appl. No.: 732,743

[22] Filed: Jul. 18, 1991

Related U.S. Application Data

[63] Continuation of Ser. No. 522,289, May 10, 1990, abandoned, which is a continuation-in-part of Ser. No. 401,053, Aug. 31, 1989, Pat. No. 5,053,922.

[51] Int. Cl.⁵ ............................................. H01L 23/48
[52] U.S. Cl. ........................................ 357/70; 357/71; 357/69
[58] Field of Search ..................... 357/68, 69, 70, 71, 357/54; 333/346, 347, 348, 322

[56] References Cited

U.S. PATENT DOCUMENTS 4,906,953  3/1990  Li et al. ............................... 333/246
4,912,547  3/1990  Bilowith et al. ....................... 357/71

Primary Examiner—Eugene R. LaRoche
Assistant Examiner—R. A. Ratliff

[57] ABSTRACT

A Via-Less Two-Metal Tape-Automated Bonding System [100] for providing an interface to a device having a plurality of closely spaced leads is disclosed. The preferred embodiment of the invention comprises a dielectric film [102] that bears a pattern of conductive signal traces [104] on one side [102b] of the film [102] that match the leads of an integrated circuit that is fastened to the center of the rectangular TAB frame. The side [102a] of the film which is opposite from the side [102b] bearing the signal traces [104] has a ground plane [105] attached to it that controls the impedance characteristics of the conductive elements of the TAB frame. In previous TAB designs, the ground plane [105] is connected to the chip through a ground lead [106] that is coupled to the ground plane by a via that passes through the dielectic film in a direction that is perpendicular to the two planar axes of the film. In contrast, the present invention utilizes a ground lead [106] that is formed on the same side of the dielectric film [102] which holds the ground plane [105]. An inclined segment of the ground lead [106] then runs from the edge of the ground plane [105], down and over the thickness dimension of the dielectric layer [102], and then occupies the same plane as the signal leads [104] that emanate from the signal trace or circuit side [102b] of the dielectric layer [102]. In this common plane below the ground plane [105], both signal leads [104] and ground leads [106] extend toward the chip in a generally parallel arrangement.

7 Claims, 10 Drawing Sheets

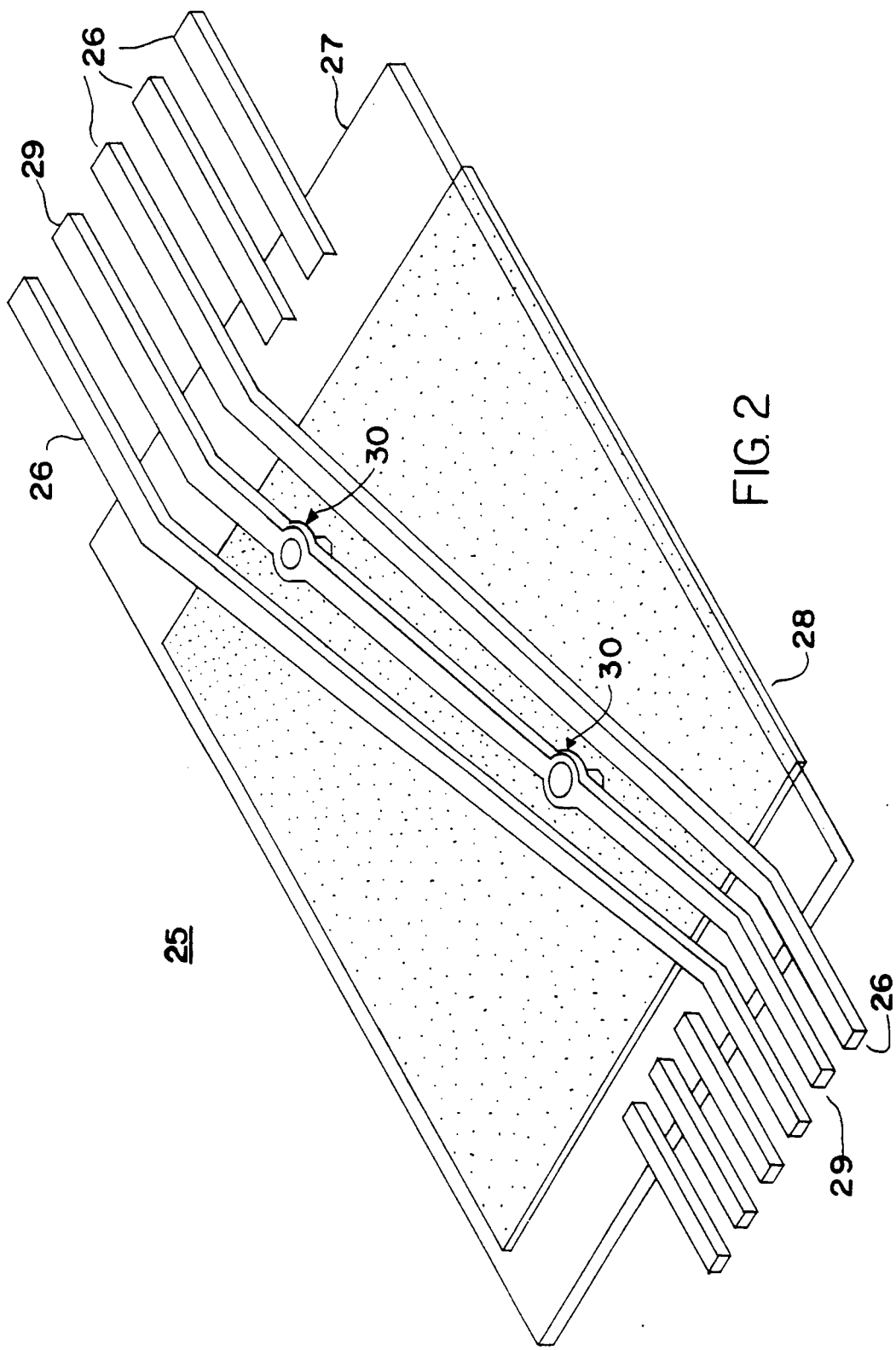

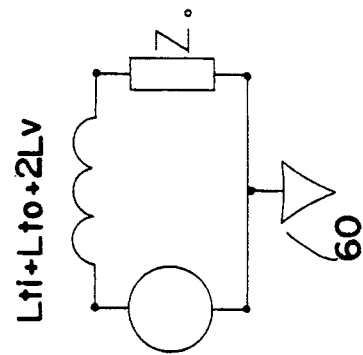
FIG.5b
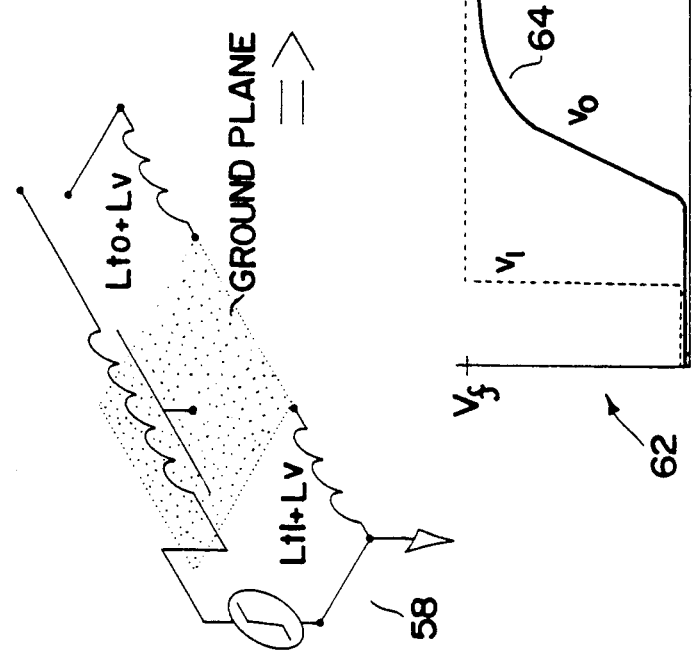
FIG.5a
FIG.5c
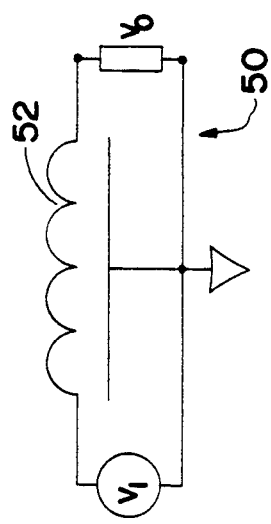
FIG. 4a
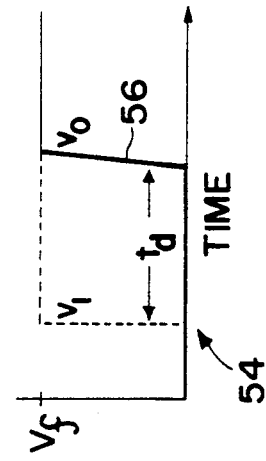
FIG.4b

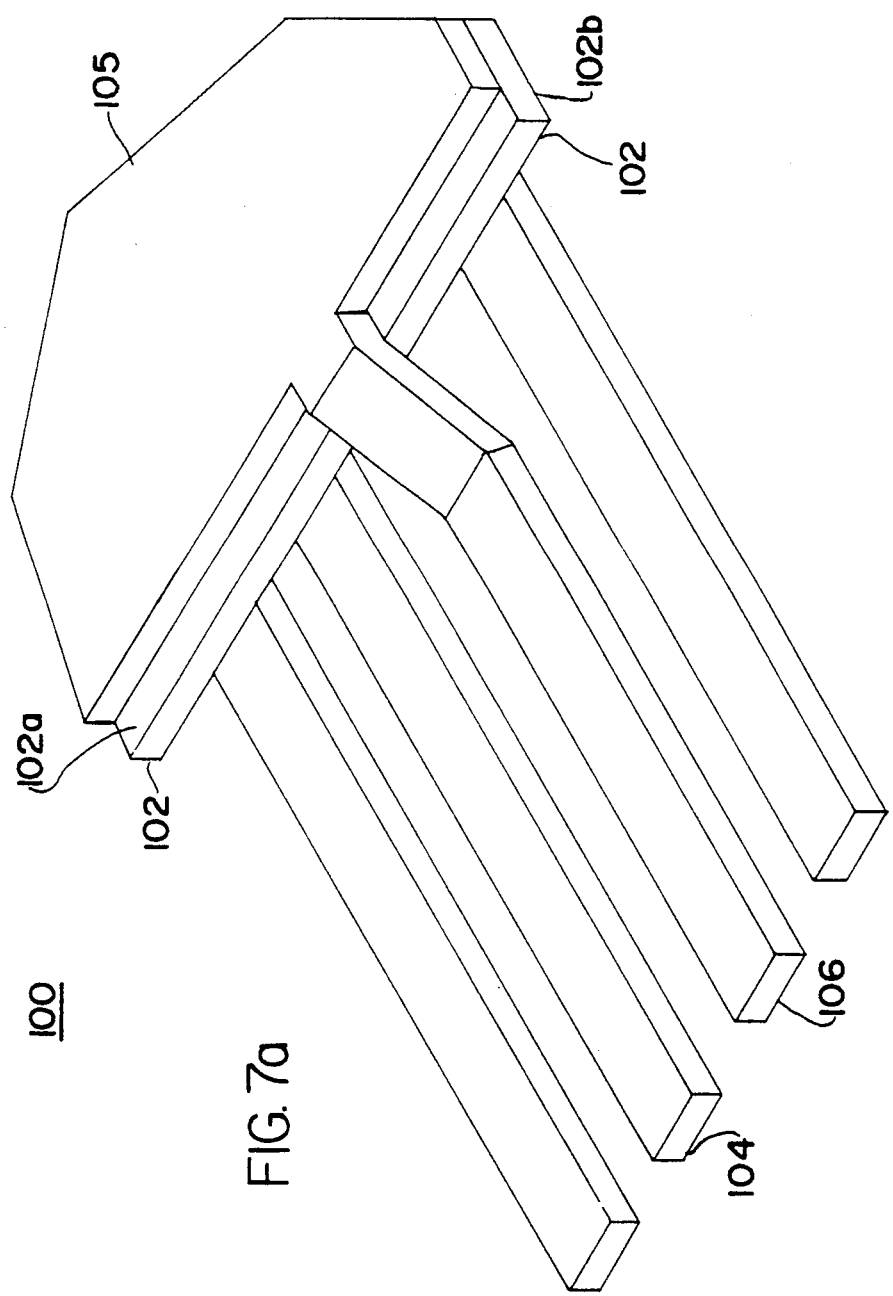

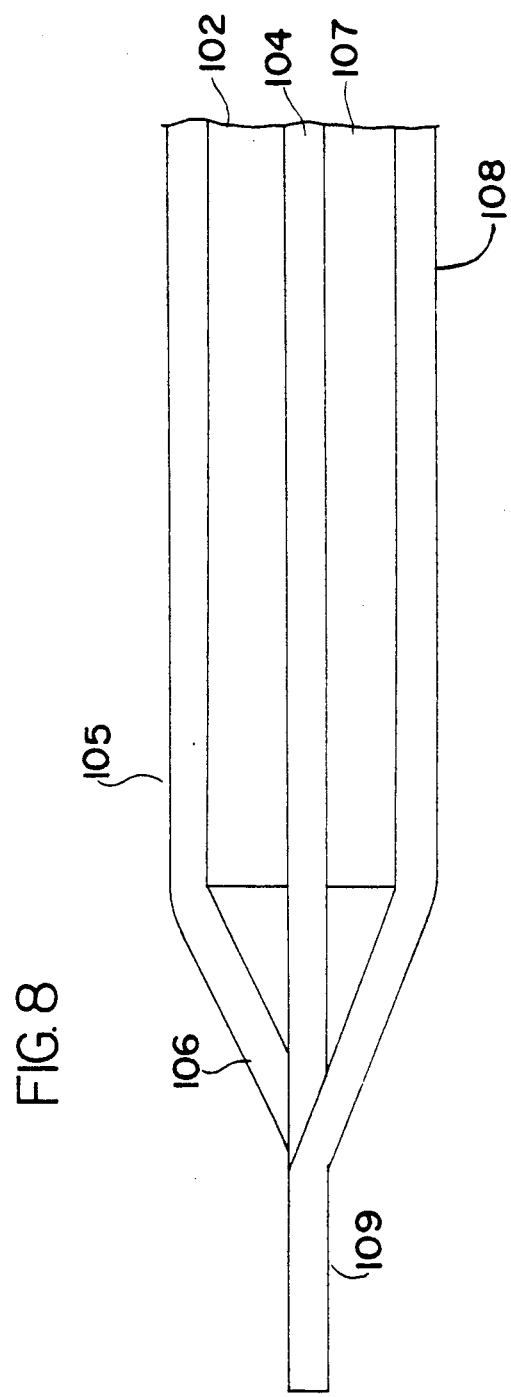

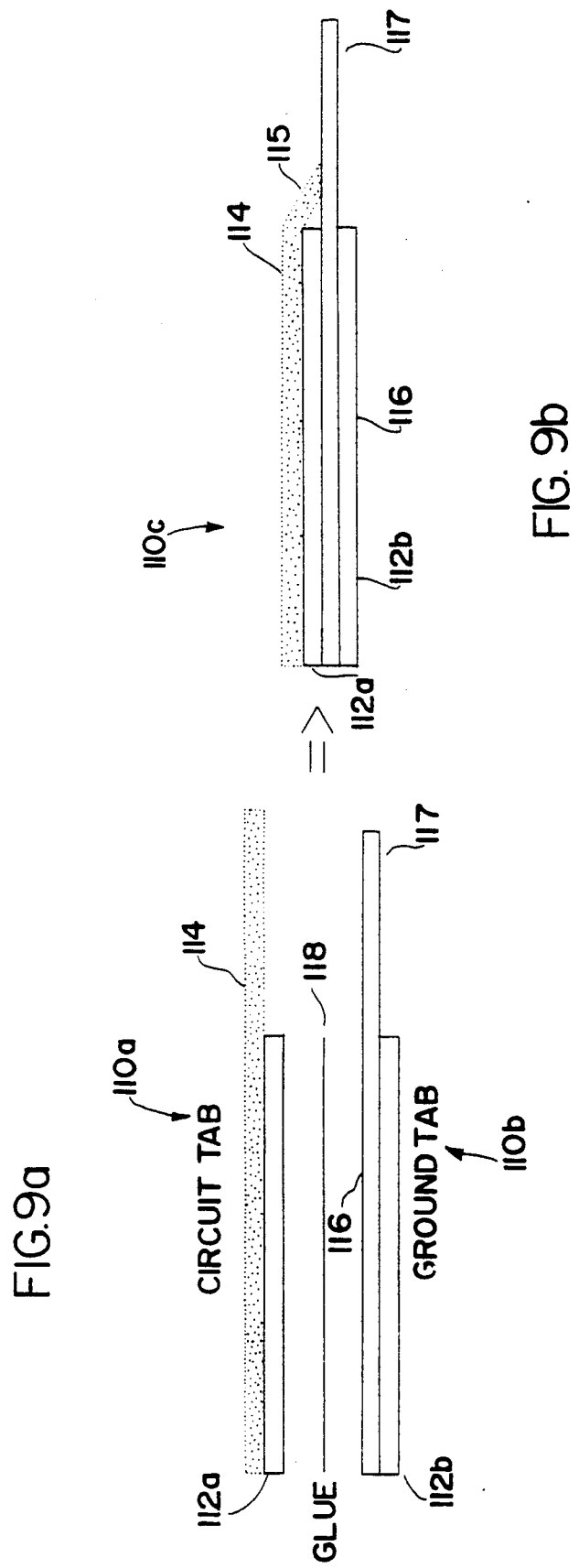

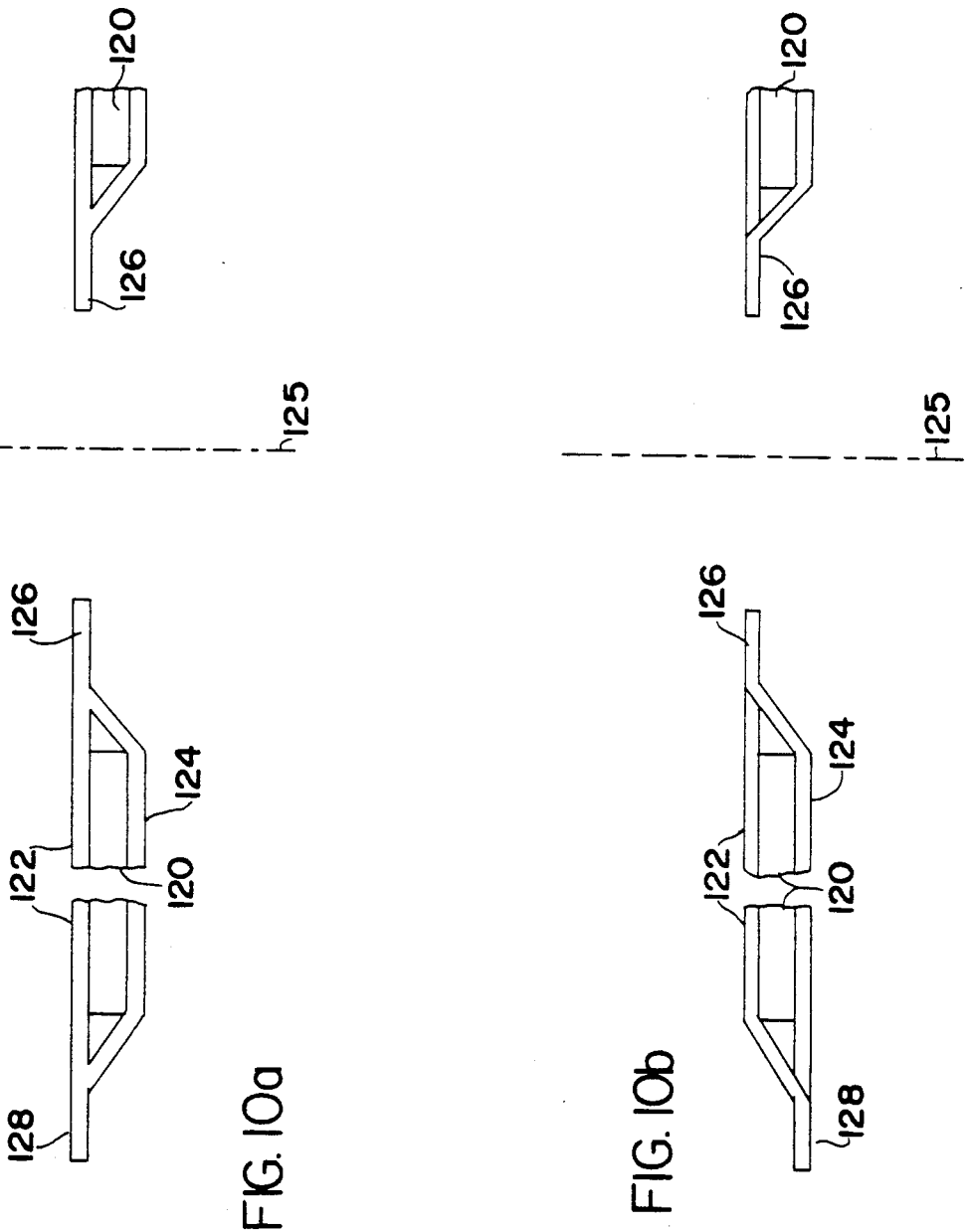

VIA-LESS TWO-METAL TAPE-AUTOMATED BONDING SYSTEM

CROSS-REFERENCE TO A RELATED PATENT APPLICATION

The present application is a continuation of copending application Ser. No. 07/522,289 filed on May 10, 1990, abandoned, which is a continuation-in-part of a commonly-assigned, pending U.S. application Ser. No. 07/401,053, now U.S. Pat. No. 5,053,922, which was filed on Aug. 31, 1989 and which is entitled "Demountable Tape-Automated Bonding System." The prior application is hereby incorporated by reference.

BACKGROUND OF THE INVENTION

The present invention includes methods and apparatus for making connections to an integrated circuit chip. The Via-Less Two-Metal Tape-Automated Bonding System provides a cost-effective and reliable device that overcomes the signal degradation that is encountered when single-metal TAB technology is employed in high speed digital and high frequency analog electronic systems.

Each year integrated circuits become more powerful and capable of storing more information. One of greatest challenges confronting designers in the electronics industry is finding more efficient and reliable methods to access the complex circuitry that resides within the chip package. A large rectangular IC chip having sides less than one half inch in length may have as many as five hundred or more leads extending from it. Each of these conductors must be physically bonded or coupled to external devices.

The basic methods of mass-producing connections to computer chips utilize a technique called "tape-automated bonding." This fabrication procedure is commonly referred to by the acronym "TAB" and is well known to persons ordinarily skilled in the electronics packaging art. A continuous insulative tape which is similar to photographic film provides a planar support for chips that are attached to individual sections or frames of the tape. TAB frames are generally rectangular or square sections that are arranged side-by-side along an uncut tape. A spider-like metal pattern of conductive traces is formed on each frame. The traces radiate from the center of the frame to its four edges. A chip is attached to the center of the TAB frame, so that the leads or contacts of the chip are precisely mated with the corresponding metal traces in the central portion of the TAB frame. The resulting assembly comprising the chip, the TAB frame, and the substrate is essentially a space transformer that employs diverging radial electrical pathways to afford ready access to the integrated circuit. FIG. 1 illustrates a conventional TAB frame application 10, in which a chip 12 is bonded in the center of a TAB frame 14. The contact pads of the chip 12 are bonded to the inner leads 16 of the TAB frame 14. The inner leads 16 are connected to outer leads 18 that extend out to the periphery of the frame 14. The TAB frame 14 is fastened to a printed circuit board 20 that includes conductive traces 22 that are connected to outer leads 18. A series of through-holes 24 are used to connect different layers of the board. The device pictured in FIG. 1 is called a "single-metal tape," since it bears one conductive metal pattern on one side of the insulative carrier film.

The electrical performance of a single-metal TAB device may not always meet the requirements of high speed digital and high frequency analog systems. Each trace or lead exhibits a self-inductance, a capacitance to ground, and a multiplicity of mutual inductances and capacitances with all the other conductors in its vicinity. The parasitic self-inductance and capacitance of a TAB lead limit the frequency bandwidth of the circuit that includes that TAB lead. As a consequence, high frequency signals propagating along this circuit will be degraded, often to the extent that the signal is corrupted so badly that the data which was intended to be transmitted is misinterpreted. Another deleterious effect produced by these parasitic inductances is the unpredictable characteristic impedance that is exhibited by single-metal TAB architecture. Because the impedance levels are neither controllable nor uniform throughout such a circuit, impedance mismatches among different portions of the circuit cause unwanted signal reflections at circuit interfaces. These reflections further degrade the signal waveform. Yet another problem encountered in single-metal TAB devices is cross-talk, an interference phenomenon that results from mutual parasitic reactances between one conductive trace and its neighbors, which leads to the undesirable transmission of signals among them.

One well-known method of reducing this interference is to add a layer of metal called a ground plane on the side of the insulative film that is opposite the side that carries the signal traces. When a ground plane is added to the back side of a dielectric film that bears a pattern of conductive traces on its front side, the resulting structure is called a "two-metal TAB frame." By placing this conductive layer that is held at ground potential near the signal leads, the self-inductance of the individual signal leads as well as the mutual inductance and capacitance experienced among them can be significantly reduced. The use of the ground plane not only improves signal fidelity, but also renders the self-inductance and self-capacitance of each lead precisely predictable and controllable. Since a two-metal TAB device presents the inherent advantage of providing a known characteristic impedance that will match other sections of a circuit, the two-metal TAB is also referred to as the "controlled-impedance TAB."

This two metal layer device, however, can be exceedingly difficult and expensive to manufacture. Previous fabrication techniques incorporate the use of connections called "vias" that pass through the dielectric material to couple conductive elements formed on the opposite sides of the dielectric layer. FIG. 2 illustrates a conventional two-metal TAB frame 25 in which conductive traces 26 are formed on a dielectric film 27 that has a metal ground plane 28 fastened to the side of the dielectric layer that is opposite from the side occupied by the conductive traces 26. A ground lead 29 is connected to the ground plane 28 by metal vias 30 that penetrate through the dielectric layer 27.

Several serious problems are encountered when these vias are formed to link conductive traces to ground planes on the opposite side of the dielectric layer. The traces are spaced together as closely as possible in order to maximize the density of leads on the TAB frame. The center-to-center distance, or "pitch," across a pair of leads may measure less than five mils. As the traces become finer and finer, it becomes more and more difficult to form holes in them that can accommodate vias. Techniques for making via holes include punching, laser drilling, or chemical methods such as wet or dry etching. Each of these methods is limited by a minimum hole size that can be formed with a high degree of accuracy that produces a sufficiently high yield rate. Typically, the minimum via hole size exceeds the width of the trace or the lead that must be connected to a ground plane below it. This constraint limits the placement of via holes to locations on the TAB frame where the traces have fanned out to provide enough space to accommodate a via hole. As TAB geometry becomes finer and more miniaturized, this problem becomes more severe, since the placement of the via holes then dictates the arrangement of traces on the dielectric film. Even when via holes are made successfully and the electrical performance of TAB device is somewhat improved, the performance still does not meet many design objectives.

Unfortunately, only a very limited number of TAB tape suppliers in the world are currently capable of producing a two or multi-metal TAB device. The problem posed by the manufacture of these structures is the extremely difficult job of consistently and accurately forming the fine holes that accommodate the vias that connect the ground leads to the ground plane. Because this process is so tedious and since current yield rates are so low, the average cost of two-metal TAB frames are considerably greater than the cost of two equivalent single-metal TAB frames. The expensive two-metal TAB devices that are available have generally been found to be less reliable than their single-metal counterparts. Most of the failures that have been observed involve the vias, which are the weakest elements in conventional two-metal TAB architecture. Even though the electrical performance of a two-metal TAB is usually better than that of a one-metal device, the use of the vias poses its own performance limitations and diminishes the overall advantage of employing a conventional two-metal TAB to make connections to a chip.

The problem of providing reliable multi-metal TAB frame devices that avoid the detrimental side effects that inherently accompany the use of conductive vias that penetrate through the dielectric layer in the center of the TAB frame has presented a major challenge to designers in the automated electronic packaging field. The development of a relatively low cost, rugged, and versatile system that does not suffer from the design constraints imposed by these vias would constitute a major technological advance in the electronics business. The enhanced performance that could be achieved using such an innovative device would satisfy a long felt need within the industry and would enable electronic equipment manufactures to save substantial expenditures of time and money.

SUMMARY OF THE INVENTION

The Via-Less Two-Metal Tape-Automated Bonding System disclosed and claimed in this patent application solves the problems encountered by conventional two-metal TAB frame designs. The unwanted signal interference caused by uncontrolled and unmatched impedance levels is substantially eliminated by employing a multi-metal design that does not utilize vias that penetrate through insulative layers to couple conductive elements in the TAB frame. Although very expensive two-metal TAB devices that reduce this interference impediment are currently available, the present invention overcomes the severe limitations and manufacturing difficulties encountered in the use and production of conventional systems that incorporate vias.

The preferred embodiment of the invention comprises a dielectric film that bears a pattern of conductive signal traces on one side of the film that match the leads of an integrated circuit that is fastened to the center of the rectangular TAB frame. The side of the film which is opposite from the side bearing the signal traces has a ground plane attached to it that controls the impedance characteristics of the conductive elements of the TAB frame. In previous TAB designs, the ground plane is connected to the chip through a ground lead that is coupled to the ground plane by a via that passes through the dielectric film in a direction that is perpendicular to the two planar surfaces of the film. In contrast, the present invention utilizes a ground lead that is formed on the same side of the dielectric film which holds the ground plane. An inclined segment of the ground lead then runs from the edge of the ground plane, down and over the thickness dimension of the dielectric layer, and then occupies the same plane as the signal leads that emanate from the signal trace or circuit side of the dielectric layer. In this common plane below the ground plane, both signal leads and ground leads extend toward the chip in a parallel arrangement.

An alternative embodiment of the invention includes two single-metal TAB frames, a circuit TAB and a ground TAB, that are laminated together with a bonding agent to form a single two-metal TAB assembly. This embodiment constitutes only one of many multimetal designs that are the logical and beneficial extension of the Applicant's important innovation.

The Applicant's invention is a high performance chip interface device that addresses the troublesome fabrication difficulties posed by conventional single-metal TAB designs. The invention not only overcomes the fabrication difficulties explained above, but also improves the performance of the TAB frame by reducing ground inductance, which is described in detail below. This innovative method and apparatus provide an effective, efficient, and reliable tool that will enable manufactures of electronic equipment to create high quality products that will benefit a wide variety of consumers of the electronic and computer systems.

An appreciation of other aims and objectives of the present invention and a more complete and comprehensive understanding of this invention may be achieved by studying the following description of a preferred embodiment and by referring to the accompanying drawings.

BRIEF DESCRIPTION OF THE DRAWINGS

FIG. 2 illustrates a conventional two-metal TAB structure that utilizes vias that protrude through a dielectric layer to connect ground leads to a ground plane.

FIG. 4(a) is a schematic diagram of an idealized signal trace. A plot of this digital signal propagating along this signal trace is shown in FIG. 4(b). A schematic diagram that represents the impedance in an actual signal trace which includes harmful parasitic inductance is pictured in FIGS. 5(a) and 5(b). These deleterious components of inductance produce a signal having a degraded risetime, which is shown in FIG. 5(c).

FIG. 7a is a partial perspective schematic view of one embodiment of the present invention, a via-less two-metal TAB structure.

FIG. 8 is a partial schematic view of a second embodiment of the present invention, a via-less three-metal TAB structure that includes two ground planes.

FIG. 9(a) provides a view of one of the fabrication processes that may be employed to manufacture the present invention. Two single-metal TAB frame structures, a circuit TAB frame and a ground plane TAB frame, are glued together to form a via-less two-metal TAB frame assembly shown in FIG. 9(b).

FIGS. 10(a) and (b) illustrate alternative embodiments of the present invention.

DETAILED DESCRIPTION OF A PREFERRED EMBODIMENT

Conventional TAB Frame Designs

Figure 1:
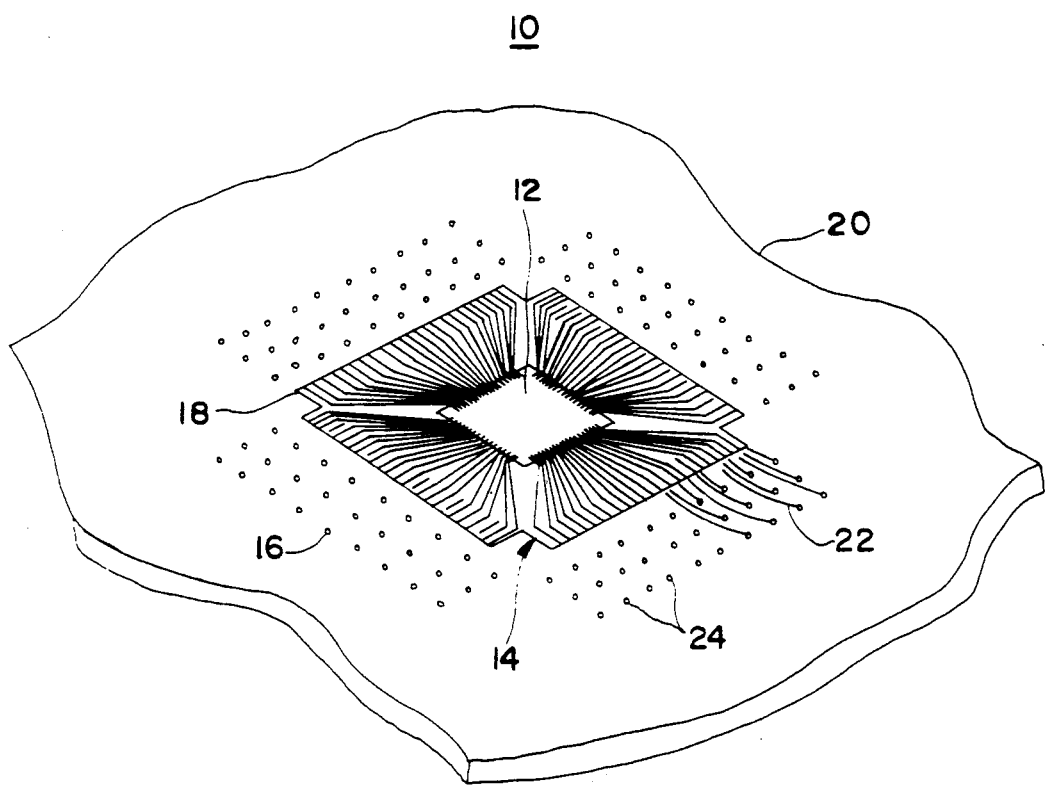
FIG. 1 is a perspective view of the basic embodiment of a conventional Tape-Automated Bonding (TAB) frame bearing an integrated circuit.

FIG. 1 illustrates the basic embodiment of a conventional Tape-Automated Bonding (TAB) System 10 with a chip 12 fastened in its central section. The TAB frame 14 includes inner leads 16 and outer leads 18. Frame 14 resides on a printed circuit board substrate 20 which itself includes conductive traces 22 emanating from through-holes 24.

FIG. 2 reveals a conventional Two-Metal TAB frame 25 with vias comprising a group of signal traces 26 formed on a dielectric layer 27, and a ground plane 28 attached beneath the dielectric 27. Ground leads 29 are also attached to the insulative layer 27 and are connected to ground plane 28 through conductive vias 30.

Figure 3B:
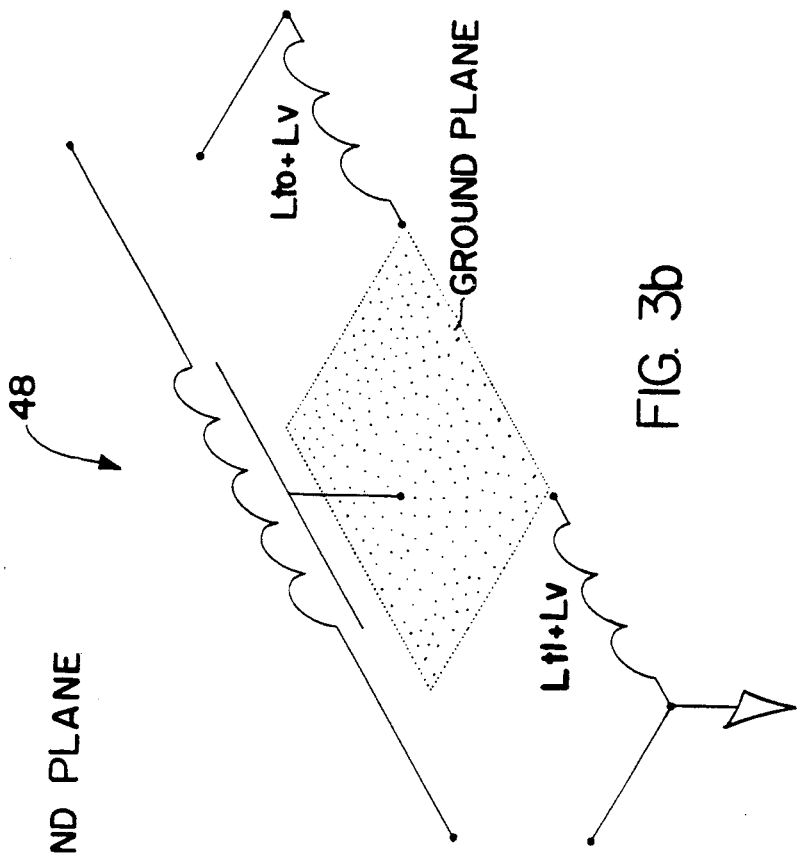
FIGS. 3(a) and (b) depict the harmful ground inductance that is encountered in a conventional two-metal TAB structure that includes vias.
Figure 3A:
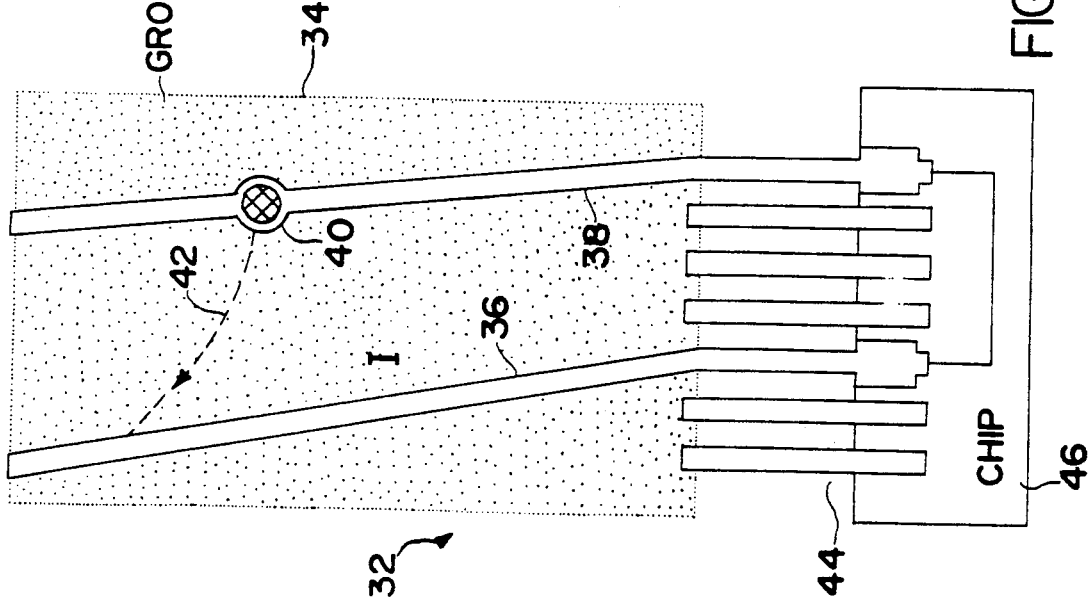

FIGS. 3(a) and 3(b) provide schematic depictions of the ground inductance encountered when conventional TAB systems are employed. The TAB frame 32 shown in FIG. 3(a) includes a ground plane 34, traces 36 and 38, and a via 40 through trace 38. For the sake of simplicity, only two traces are shown in this figure, but the TAB frame actually includes many traces. Leads 44 connect the TAB frame to a chip 46. FIG. 3(b) presents a schematic circuit diagram 48 which corresponds to the circuit elements portrayed in FIG. 3(a). The portion of trace 38 that leads to the inside via 40 may have a significant inductance Lti. Similarly, a second portion of the trace 38 that leads to the outside via (not shown) contributes an inductance Lto. The total parasitic inductance in the ground circuit, Lg, is:

$$Lg = Lti + Lto + 2Lv,$$

where Lv is the inductance of the via. This inductance, Lg, can be large enough to cause a number of harmful effects. FIG. 4(a) portrays a schematic diagram 50 of an ideal transmission line which includes an input voltage Vi, propagating along an ideal trace, represented by a transmission line 52 and producing an output voltage Vo on a load. FIG. 4(b) shows these signals Vi and Vo. In this ideal situation, the signals are identical, but the output signal Vo is delayerd by a certain time td. In an actual standard two-metal TAB, shown in FIGS. 3(a) and 3(b), the parasitic inductance shown in FIG. 3(b) causes the risetime of the digital signal 56 propagating along signal trace 52 to be degraded to about 2.5 times the time constant of the circuit shown schematically in FIGS. 5(a) and 5(b). The risetime is the horizontal distance along the t-axis measured from the point on the t-axis where V=0 to the point on the V-axis where V=Vf. The degradation in the risetime shown best by FIG. 5(c).

Figures 6A, 6B:
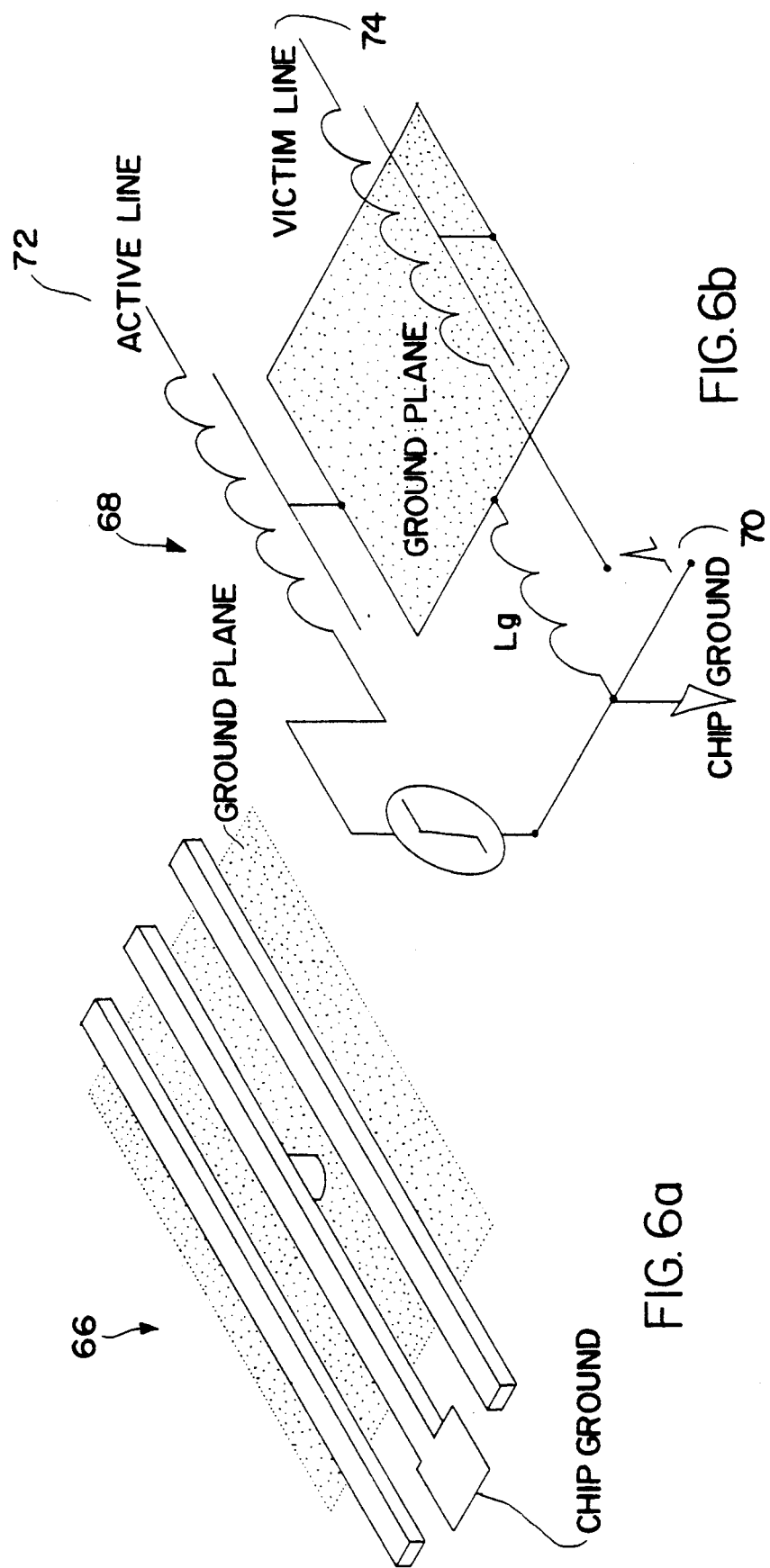
FIG. 6(a) shows a group of traces in a conventional two-metal TAB frame that employs vias to connect a ground plane to a ground trace.
FIG. 6(b) is an equivalent circuit of the structure shown in FIG. 6(a). The presence of the common ground inductance causes unwanted cross-talk between the other signal traces.
Figure 11A:
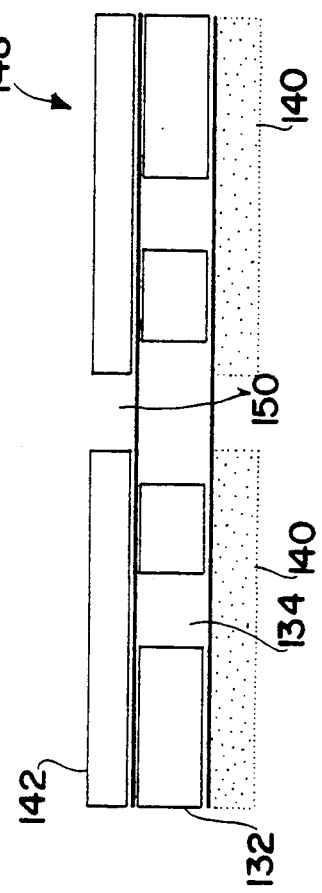
FIGS. 11(a), (b), (c), and (d) depict the fabrication steps utilized in the manufacture of a via-less TAB structure using a single dielectric film.
Figure 11B:
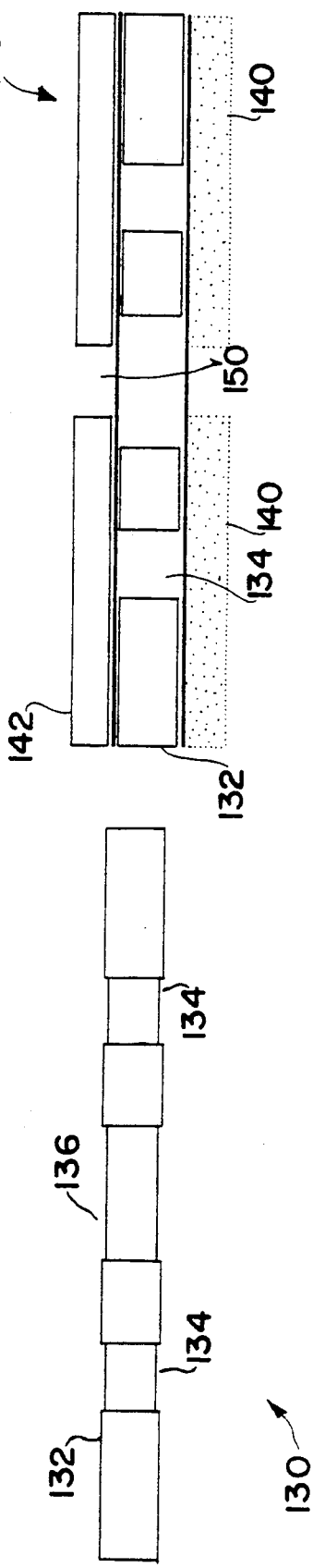
Figure 11C:
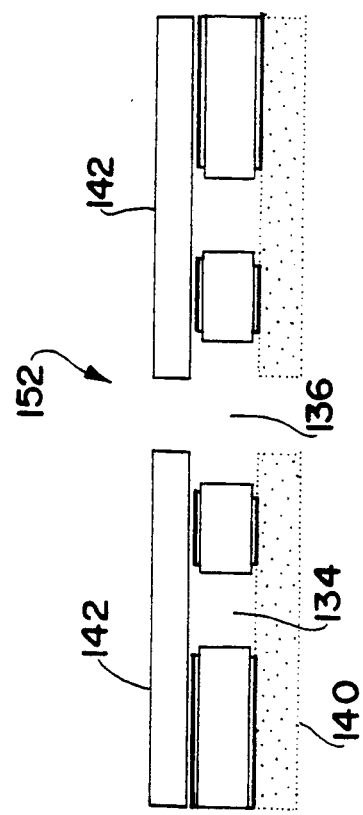
Figure 11D:
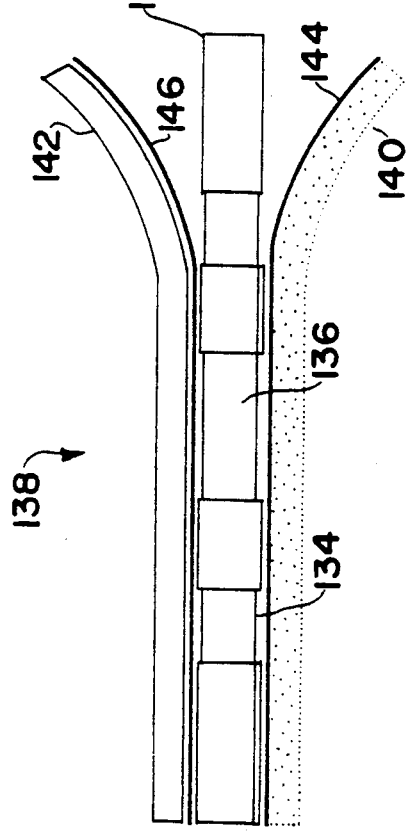

Another problem encountered with conventional TAB systems is the electrical "bounce" of the ground potential which occurs when a relatively large current, I, is switched in a short time ts. The magnitude of that voltage bounce, Vb, is given by the expression:

$$Vb = Lg(I/ts),$$

where Lg is the ground inductance described above. Finally, inductance Lg also acts as a common ground inductance for different circuits like structure 66 pictured in FIG. 6(a). FIG. 6(b), a schematic diagram of FIG. 6(a), depicts the unwanted cross-talk 70 which occurs between active line 72 and victim line 74.

As TAB geometries become denser, each of these problems becomes more severe, since denser circuit layouts require narrow and longer leads and smaller vias. The formation of these smaller and generally unreliable vias greatly complicates the TAB fabrication process, lowers the manufacturing yield significantly, and makes the production cost unacceptably high.

The Present Invention

FIG. 7a illustrates a schematic partial view of the Via-Less Two-Metal TAB Frame 100, which includes a first dielectric layer 102 having a first and a second side 102a and 102b. Signal leads 104 protrude from beneath dielectric layer 102. A ground plane 105 is attached to the first side 102a of dielectric layer 102. A ground lead 106 is connected to ground plane 105, includes an inclined portion which runs over the edge of dielectric layer 102, and generally lies in the same plane occupied by signal leads 104, which are attached to the second side 102b of the dielectric layer 102.

FIG. 8 presents a schematic depiction of an alternative embodiment of the invention. The TAB structure shown in FIG. 8 includes a first ground plane 105, a first ground lead 106, a first dielectric layer 102, a layer of signal leads 104, a second dielectric layer 107, a second ground plane 108, and a second ground lead 109.

FIGS. 9(a) and 9(b) supply side views of the fabrication steps of a Via-Less Two-Metal TAB System. FIG. 9(a) discloses a circuit TAB 110a having a dielectric layer 112a and a pattern of signal traces 114. The same illustration reveals a ground TAB 110(b) having a ground plane 116 and a ground lead 117. The two single-metal TABs 110a and 110b are glued together in FIG. 9(b) to form an assembled two-metal TAB 110(c), in which one end of the signal traces 114 are bent over the edge of the dielectric layer so that a number of signal traces leads 115 occupy the same plane as ground lead 117. Precise alignment of the two single-metal frames is insured by using two frames which both bear identical sets of lithographically defined registration holes (not shown). During the gluing process, these registration holes are held in alignment by registration pins (not shown). Some commonly available TAB tapes have pre-formed sprocket holes that provide alignment during the fabrication process.

FIGS. 10(a and b) depict other alternative embodiments of the invention. FIG. 10(a) presents a side view of a TAB structure that includes a central film carrier 120 having first and second metal layers 122 and 124 attached to either side of the insulative film 120. A center line of the TAB frame is indicated schematically by reference numeral 125. Metal layers 122 and 124 both lie in the same plane as is occupied by inner leads 126 and outer leads 128. FIG. 10(b) provides a side view of a TAB structure in which the inner leads 126 are formed to be coplanar with one of the two metal layers, in this case, the first 122; and the outer leads 128 are formed to be coplanar with another metal layer, in this case, the second 124.

FIG. 11 depicts manufacturing processes which are known to those skilled in the TAB construction art and which may be utilized to produce the preferred embodiment of the invention. FIG. 11(a) presents a view of the invention after a first manufacturing step 130 has been performed, in which windows have been punched in a dielectric carrier film. The carrier film 132 includes outer lead windows 134 and inner lead windows 136. A second step 138 pictured in FIG. 11(b) reveals two layers of metal foil 140 and 142 being laminated to carrier film 132. Two layers of glue 144 and 146 are shown between the metal foil 140 and 142 and the carrier 132. FIG. 11(c) depicts a third operation 148 after pattern features 150 have been formed in the layers of metal foil 140 and 142. The final product 152 is illustrated in FIG. 11(d).

The via-less structure may be fabricated by punching inner-lead windows, outer-lead windows, and sprocket holes in the carrier film. The two metallic films, which are identical in thickness, are laminated on to the carrier film. The two sides of the structure are then patterned while held in precise alignment. As an alternative, the surfaces of the metal films facing the insulative carrier film would be passivated prior to the lamination step using a chemical treatment or a coating which is resistant to an etchant that is used to etch a series of metal patterns. This variation keeps the etchant from attacking the back surfaces of the traces. After the patterns are formed, the passivation layer is dissolved and removed by a chemical which does not attack the insulating film or conductive patterns to a great extent. The conductive traces are typically copper, while a thin film of black oxide may be used as the etch-resistant layer.

The present invention provides a much lower ground inductance than are provided by conventional designs because the lead lengths from the TAB ground plane to the ground planes of the chip and substrate are shorter. The ground inductance of the present invention is also lower because via holes are not employed. The absence of via holes greatly simplifies the fabrication of the TAB frames and reduces the manufacturing costs. The resulting frames are far more reliable because the via holes, which are the chief source of failure in conventional systems, are not utilized. The layout of the traces on the circuit side of the TAB frame is also easier to form, since all the ground leads have been removed from that side to the opposite side of the ground plane.

The Via-Less Two-Metal TAB System disclosed and claimed in this patent application constitutes a major step forward in the electronics packaging art and will provide a valuable tool for designers and manufacturers of electronic systems.

Although the present invention has been described in detail with reference to a particular preferred embodiment, persons possessing ordinary skill in the art to which this invention pertains will appreciate that various modifications and enhancements may be made without departing from the spirit and scope of the claims that follow.

What is claimed is:

1. A controlled-impedance tape automated bonding frame for providing electrical connection to an electronic component having a row of closely spaced conductors comprising:

a ground plane, said ground plane being a metal foil;

a plurality of first traces extending from an edge of said ground plane, said first traces being integral with said ground plane to provide a unitary structure therewith;

a substantially flat insulative layer having a first surface fixed to said ground plane, said insulative layer being free of electrical connection vias, said first traces cantilevered from a first edge of said insulative layer; and a pattern of conductive signal traces on a second surface of said insulative layer opposite to said first surface, said signal leads having outer lead portions cantilevered from said second edge of said insulative layer, said outer lead portions interleaved with said first traces, said outer lead portions being coterminus with said first traces, said outer lead portions and said first traces having coplanar ends;

wherein the electrical potential of said ground plane is independent of connecting said signal leads to said electronic component.

2. The frame of claim 1 further comprising:

a second layer of insulator material fixed to a side of said ground plane opposite to said insulative layer; and a second ground plane fixed to said second layer having integral second traces cantilevered from said second layer, said second traces having ends interleaved and coplanar with said first traces and said outer lead portions.

3. The frame of claim 2 wherein said second layer is free of vias.

4. The frame of claim 1 wherein said ground plane is a unitary piece of flat metal electrically isolated from said signal leads prior to connection of said first traces to said electronic component.

5. A method of fabricating a controlled-impedance tape automated bonding frame for electrical connection to an electronic device comprising the steps of:

patterning a metal foil such that ground traces are formed to extend from an edge of a ground plane, said patterning including leaving said ground plane as a solid layer of metal;

providing a via-free insulative layer attached to a first surface of said ground plane such that said ground traces are cantilevered from said insulative layer;

fixing a pattern of conductive traces to a surface of said insulative layer opposite to said ground plane, said step of fixing including leaving each of said conductive traces electrically isolated from said ground plane, said step of fixing being such that said conductive traces have outer lead portions cantilevered from said insulative layer, said step of fixing further including interleaving said outer lead portions with said ground traces and aligning said outer lead portions to be coterminus with said ground traces.

6. The method of claim 5 further comprising attaching a second via-free insulative layer to said pattern of conductive traces prior to said step of fixing said conductive traces to said insulative layer that is attached to said first surface of the ground plane, thereby sandwiching said conductive traces between insulative layers.

7. The method of claim 5 further comprising bending one of said outer lead portions and said ground traces such that said outer lead portions and said ground traces are coplanar.

* * * * *